(12) United States Patent
Kim

(10) Patent No.: US 6,272,065 B1
(45) Date of Patent: Aug. 7, 2001

(54) ADDRESS GENERATING AND DECODING CIRCUIT FOR USE IN BURST-TYPE RANDOM ACCESS MEMORY DEVICE HAVING A DOUBLE DATA RATE, AND AN ADDRESS GENERATING METHOD THEREOF

(75) Inventor: Sung-Ryul Kim, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/368,391

(22) Filed: Aug. 4, 1999

(30) Foreign Application Priority Data

Aug. 4, 1998 (KR) .................................................. 98-31669

(51) Int. Cl.[7] .................................................. G11C 8/00
(52) U.S. Cl. .................................... 365/233; 365/236
(58) Field of Search ........................ 365/233, 230.08, 365/236, 239; 711/218, 219

(56) References Cited

U.S. PATENT DOCUMENTS

| | | | |
|---|---|---|---|
| 5,452,261 | 9/1995 | Chung et al. | 233/365 |
| 5,481,581 | 1/1996 | Jonas, Jr. | 55/377 |
| 5,594,702 | * 1/1997 | Wakeman | 365/230.05 |
| 5,594,765 | 1/1997 | Oh | 44/377 |
| 5,596,616 | 1/1997 | Jeang | 56/377 |
| 5,708,688 | 1/1998 | Ting et al. | 33/377 |
| 6,006,288 | * 12/1999 | McIntyre | 710/35 |

* cited by examiner

Primary Examiner—A. Zarabian
(74) Attorney, Agent, or Firm—Marger Johnson & McCollom, P.C.

(57) ABSTRACT

Disclosed is a burst-type random access memory device with a double data rate scheme, in which at least two data is inputted/outputted to/from the memory device during a clock cycle. In the burst-type random access memory device, a first address generator is further provided, which generates a sequence of addresses in response to an externally applied initial address, wherein the first addresses correspond to a first half period of the clock cycle during a burst mode of operation, respectively. And, in the memory device, a second address generator is furthermore provided, which receives the addresses from the first address generator and generates a sequence of addresses in accordance with burst information signals each indicative of a burst length and a type of the burst mode of operation, wherein the second addresses correspond to a second half period of the clock cycle during the burst mode of operation, respectively. According to the burst-type random access memory device, the second address generator is implemented such that the address for the second half period of a clock cycle is automatically generated in accordance with the burst length and mode. With the configuration, the access of the burst-type random access memory device with the DDR scheme can be speeded up.

13 Claims, 10 Drawing Sheets

Table 1

| | Sequential | | | | Interleaved |
|---|---|---|---|---|---|
| | BL4 | | BL8 | | BL4 and 8 |
| | A0B=0 | A0B=1 | A0B=0 | A0B=1 | A0B=0 or 1 |
| S1 | 0 | 1 | 0 | 1 | 1 |
| S2 | 1 | 1 | 0 | 1 | 1 |

Fig. 10

Table 2

| | Sequential | | | | | | Interleaved |
|---|---|---|---|---|---|---|---|
| | BL4 | | BL8 | | BL16 | | BL4,8,16 |
| | A0B=0 | A0B=1 | A0B=0 | A0B=1 | A0B=0 | A0B=1 | A0B=0 or 1 |
| S1 | 0 | 1 | 0 | 1 | 0 | 1 | 1 |
| S2 | 1 | 1 | 0 | 1 | 0 | 1 | 1 |
| S3 | 1 | 1 | 1 | 1 | 0 | 1 | 1 |

ADDRESS GENERATING AND DECODING CIRCUIT FOR USE IN BURST-TYPE RANDOM ACCESS MEMORY DEVICE HAVING A DOUBLE DATA RATE, AND AN ADDRESS GENERATING METHOD THEREOF

FIELD OF THE INVENTION

The present invention relates to a random access memory device, and more particularly to an address generating and decoding circuit for use in the burst-type random access memory that has a double data rate, and to an address generating method thereof.

BACKGROUND OF THE INVENTION

Video random access memory (RAM), synchronous RAM and burst RAM require generating a sequence of internally generated addresses (referred to as "an address burst" or "an address sequence") for high-speed access thereof. In general, a start address (or initial address) of particular address burst is supplied from the exterior (for example, host computer or processor). Then, when next clock signals reach an address generator, next addresses of the particular address burst are sequentially generated in an address generator during a burst period.

Address generator technologies for performing such a function are disclosed in U.S. Pat. No. 5,596,616, entitled "Burst Address Sequence Generator For Addressing Static Random-Access-Memory Devices", U.S. Pat. No. 5,708,688, entitled "High Speed Programmable Burst Address Generation Circuit", and U.S. Pat. No. 5,452,261, entitled "Serial Address Generator For Burst Memory", which are hereby incorporated by reference.

The above mentioned references are used in random access memory devices each of which has a single data rate scheme. This means that only one data is inputted/outputted to/from the memory devices during one clock cycle. Although high-speed access operation can be performed by implementing a burst mode in each random accesses memory device, users continue to require more rapid access operation.

In order to satisfy such a requirement, the double data rate scheme (hereinafter, referred to as "DDR scheme") has been proposed, in which at least two data is inputted/outputted to/from the memory device during one clock cycle (or a system clock cycle). The burst-type random access memory device with such a DDR scheme can have about twice access speed, as compared with that having the single data rate scheme.

To input/output two data during one clock cycle in the burst-type random access memory device with the DDR scheme, addresses are required to be generated during a first logic state period of the clock cycle and during a second logic state period thereof, respectively. This requires two address generating circuits, one for generating an address for the first logic state period (hereinafter, referred to as a first half period), and the other for generating an address for the second logic state period (hereinafter, referred to as a second half period).

Referring to FIG. 1, there is illustrated A block diagram of a conventional address generating and decoding circuit for use in a burst-type random access memory device with the DDR scheme. An address buffer 10 receives an externally applied a multi-bit input address An, which is used as the start (or initial) address. An address sequencer 12 (typically a counter) receives the start address from the address buffer 10, and then generates a sequence of addresses for the first half period of each clock cycle in accordance with a burst mode. As is known, this burst mode can be a sequential mode or an interleaved mode. The address sequencer 12 has been disclosed in U.S. Pat. No. 5,481,581, entitled "Programmable binary/interleave sequence counter", and U.S. Pat. No. 5,594,765, entitled "Interleaved and sequential counter", which are hereby incorporated by reference.

The start address An from the address buffer 10 is supplied to a first and a second decoder 14 and 18, together with the addresses generated by the address sequencer 12. The first decoder 14 decodes the address for the first half period of each clock cycle, which is provided from the address buffer 10, and from the address sequencer 12, respectively. The second decoder 18 generates an address for the second half period of each clock cycle in response to the address from the address buffer 10 or from the address sequencer 12. A detailed circuit diagram of the second decoder 18 is illustrated in FIG. 2.

As illustrated in FIG. 2, the conventional second decoder 18 used as an address generator is embodied only by the combination of logic gate circuits. In particular, instead of an address generation structure, the second decoder 18 is configured so as to have all practicable cases of addresses for the second half period of each clock cycle by using burst length (for example, BL4 and BL8) and burst mode (an interleaved or a sequential mode) information, and address signals from the address buffer 10 or from the address sequencer 12.

According to the conventional address generating and decoding circuit structure, as more types of burst length are provided in the burst-type random access memory device with the DDR scheme, the number of the logic gate circuits and fan-in of the respective logic gate circuits are increased more and more. This is because generating an address for the second half period of each clock cycle requires combining of the addresses in all permutations for the second half period according to the burst length and the burst mode. Therefore, the access speed of the burst-type random access memory device with the DDR scheme is decreased, and the conventional second decoder 18 used as an address generator may be too complicated to be implemented in a semiconductor chip. And the required number increases geometrically for longer burst lengths.

SUMMARY OF THE INVENTION

It is therefore an object of the present invention to provide an improved address generating and decoding circuit for use in a burst-type random access memory device with a double data rate scheme.

In order to attain the above object, according to an aspect of the present invention, there is provided a burst-type random access memory device which has a memory cell array for storing data and has a double data rate scheme, in which at least two data is inputted/outputted to/from the memory device during a clock cycle. In the burst-type random access memory device, an address buffer, a first address generator and a second address generator are provided. The address buffer receives an externally applied initial address. The first address generator sequentially generates first addresses in response to the initial address from the address buffer, wherein the first addresses correspond to a first half period of the clock cycle during a burst mode of operation, respectively. And, the second address generator receives the first addresses and generates second addresses in accordance with burst information signals each indicative of a burst length and a type of the burst mode of operation, wherein the second addresses correspond to a second half period of the clock cycle during the burst mode of operation, respectively.

In the device according to the invention, the second address generator comprises an address incrementor for receiving remaining address bits of a first address except a least significant bit and incrementing a value of the remaining address bits by one to output the incremented address bits as a third address, wherein the remaining address bits correspond to the incremented address bits, respectively; a select signal generator for generating select signals in response to the burst information signals and the least significant bit of the first address, wherein the select signals correspond to the incremented address bits, respectively; and a selector for receiving the remaining address bits and the incremented address bits, wherein the selector chooses one of corresponding address bits of the first and the third address in response to the select signals and outputs the chosen address bits as a second address.

According to another aspect of this invention, there is provided a method of generating an address for a burst mode of operation in a burst-type random access memory device having a double data rate scheme in which at least two data is inputted/outputted to/from the random access memory device during a clock cycle. The method comprises the steps of receiving a first address as an initial address from the exterior; generating select signals in response to burst information signals and a least significant bit of the first address; receiving remaining address bits of the initial address except the least significant bit and incrementing a value of the remaining address bits by one to output the incremented address bits as a second address; and receiving the remaining address bits the incremented address bits and choosing one of corresponding address bits of the first and the second address in response to the select signals to output the chosen address bits as a next address of the initial address.

It will be appreciated that the resulting device has fewer components, which makes it simpler and more economical. Further, it is very amendable to scaling to longer burst lengths with a minimum increase in the number of components.

BRIEF DESCRIPTION OF THE DRAWINGS

The present invention will be described by way of exemplary embodiments, but not limitations, illustrated in the accompanying drawings in which like references denote similar elements, and in which:

FIG. 10 is a table showing values of select signals output by circuit 268 of FIG. 9;

DESCRIPTION OF THE PREFERRED EMBODIMENTS

The present invention is now more fully described with reference to the accompanying drawings.

Figure 1:
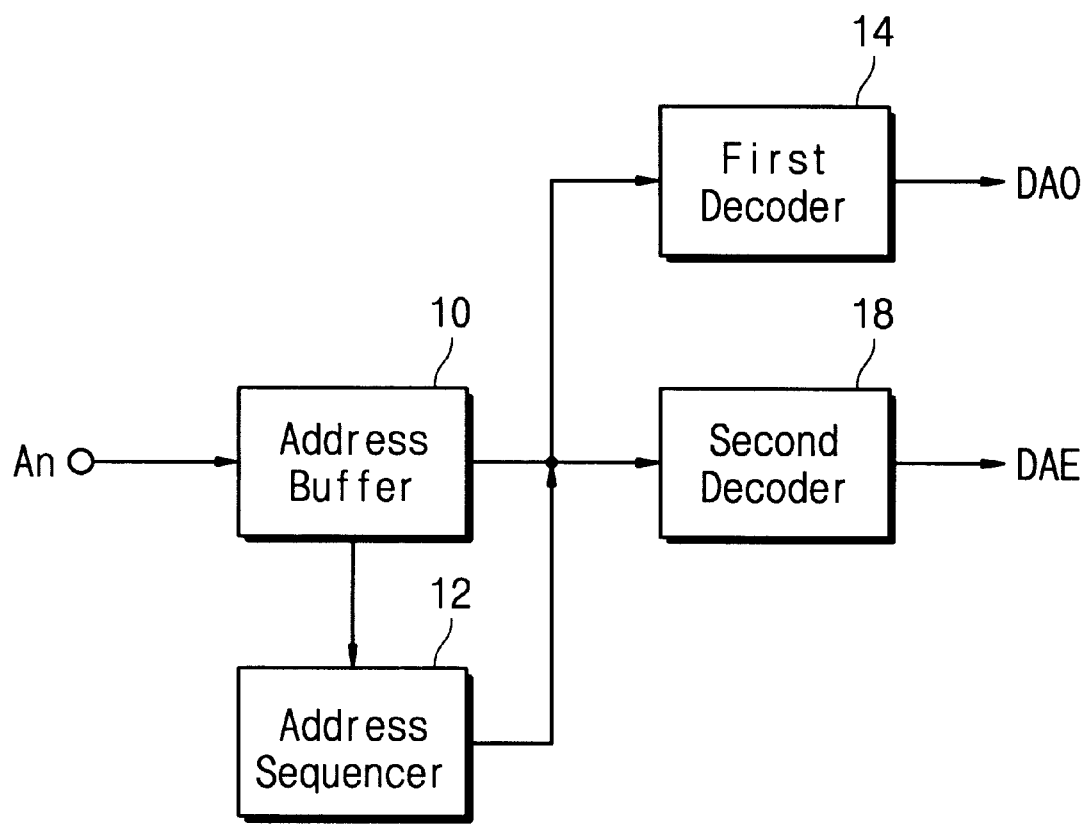
FIG. 1 is a block diagram of a conventional address generating and decoding circuit for use in a burst-type random access memory device with a double data rate scheme.
Figure 2:
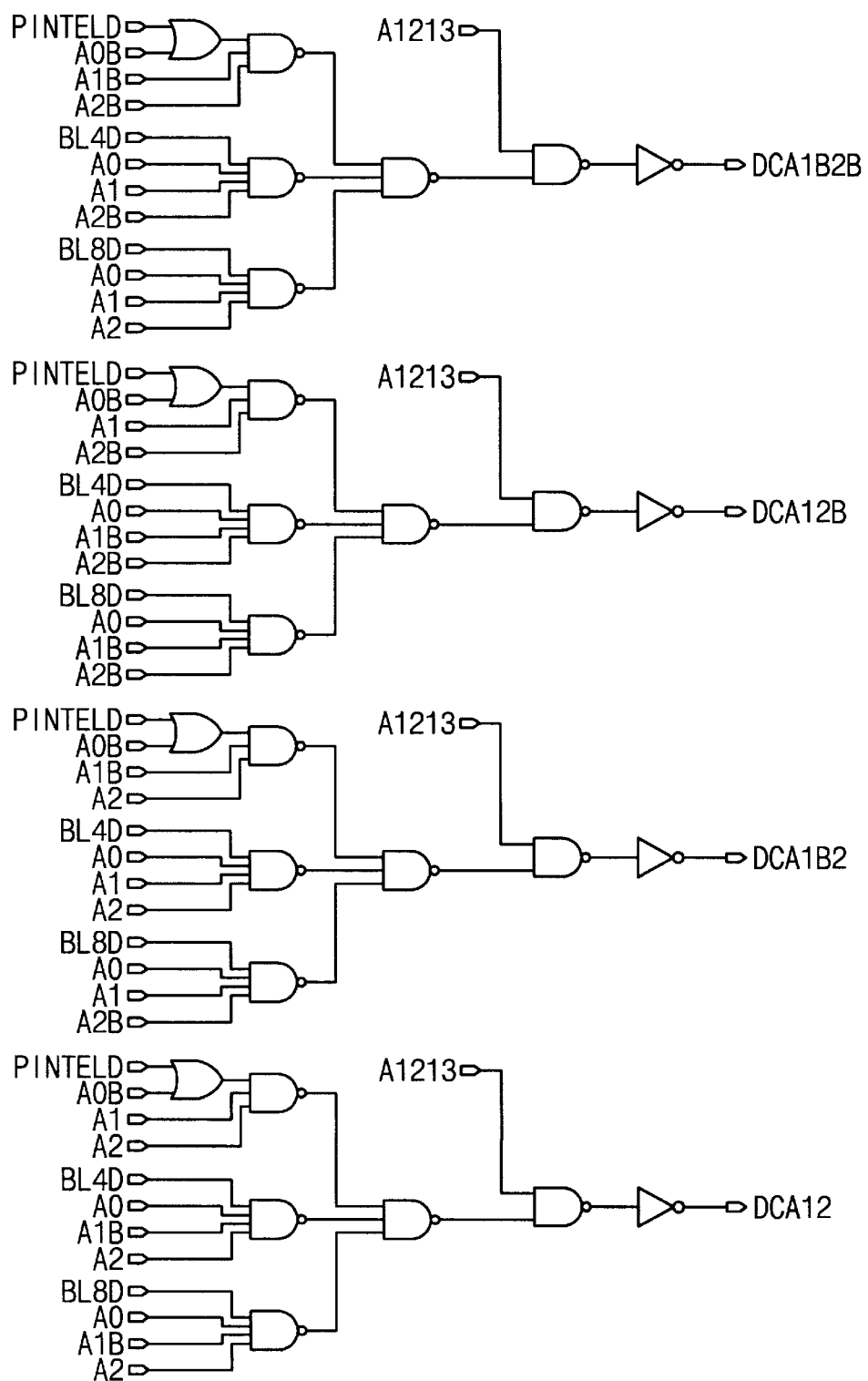
FIG. 2 is a detailed circuit diagram of the conventional second decoder 18 of FIG. 1.
Figure 3:
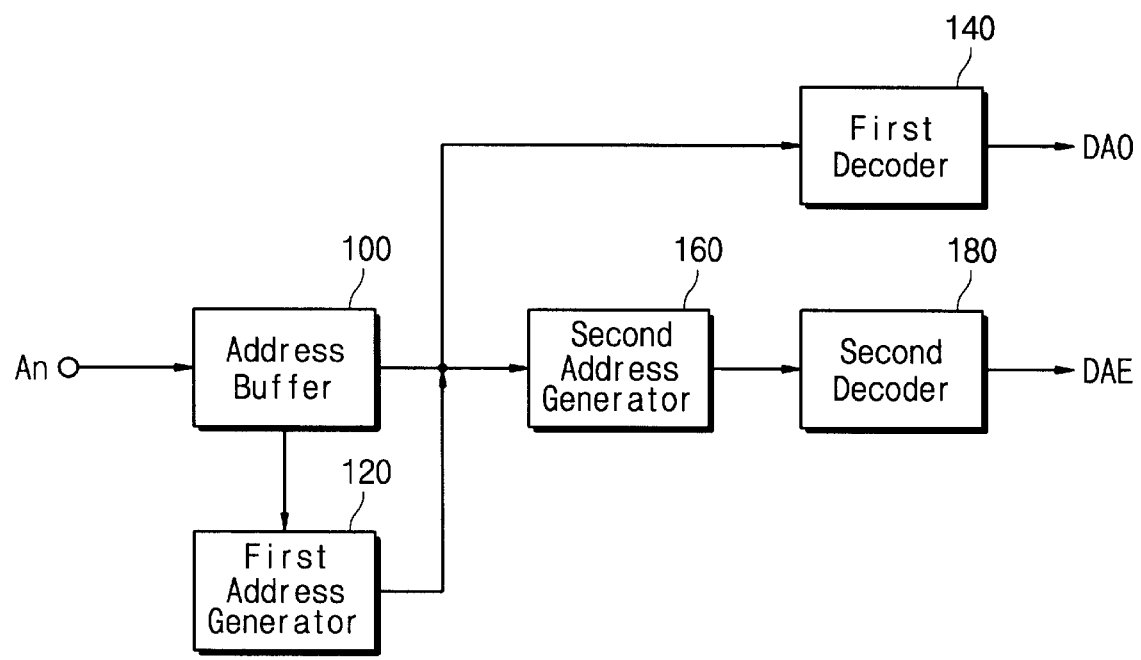
FIG. 3 is a block diagram of an address generating and decoding circuit according to the present invention.

Referring to FIG. 3, a block diagram of an address generating and decoding circuit according to the present invention is illustrated. In FIG. 3, an address buffer 100 and a first decoder 140 have the same function as those illustrated in FIG. 1, and description thereof is thus omitted. Furthermore, a first address generator 120 corresponds to the address sequencer 12 (typically a counter) of FIG. 1. Address generator 120 thus generates a sequence of addresses for a first half period of each clock cycle in response to an initial address An from the address buffer 100 during a burst mode of operation.

In the address generating and decoding circuit of the present invention, a second address generator 160 is further provided. Address generator 160 receives the sequence of addresses from the first address generator 120, and then generates addresses corresponding to the second half period of each clock cycle in accordance with both a burst length and a burst mode. The sequence of addresses from the second address generator 160 are sequentially decoded by means of a second decoder 180.

Hereinafter, two preferred embodiments of the second address generator 160 and the second decoder 180 according to the present invention will be described more fully. The first such embodiment is now described with reference to FIGS. 4–7.

Figure 4:
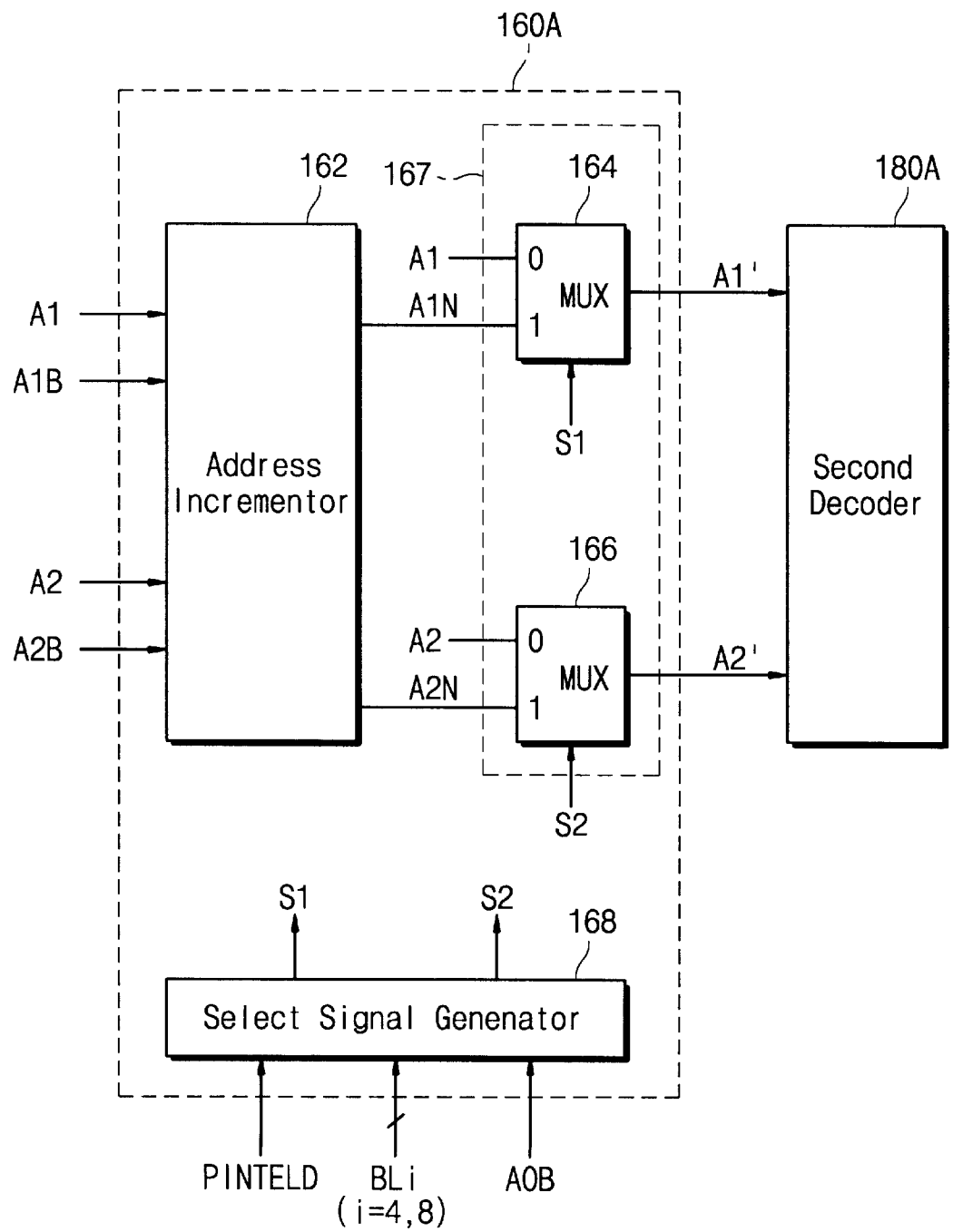
FIG. 4 shows a block diagram of the second address generator of FIG. 3 according to a first preferred embodiment of the present invention.
Figure 5:
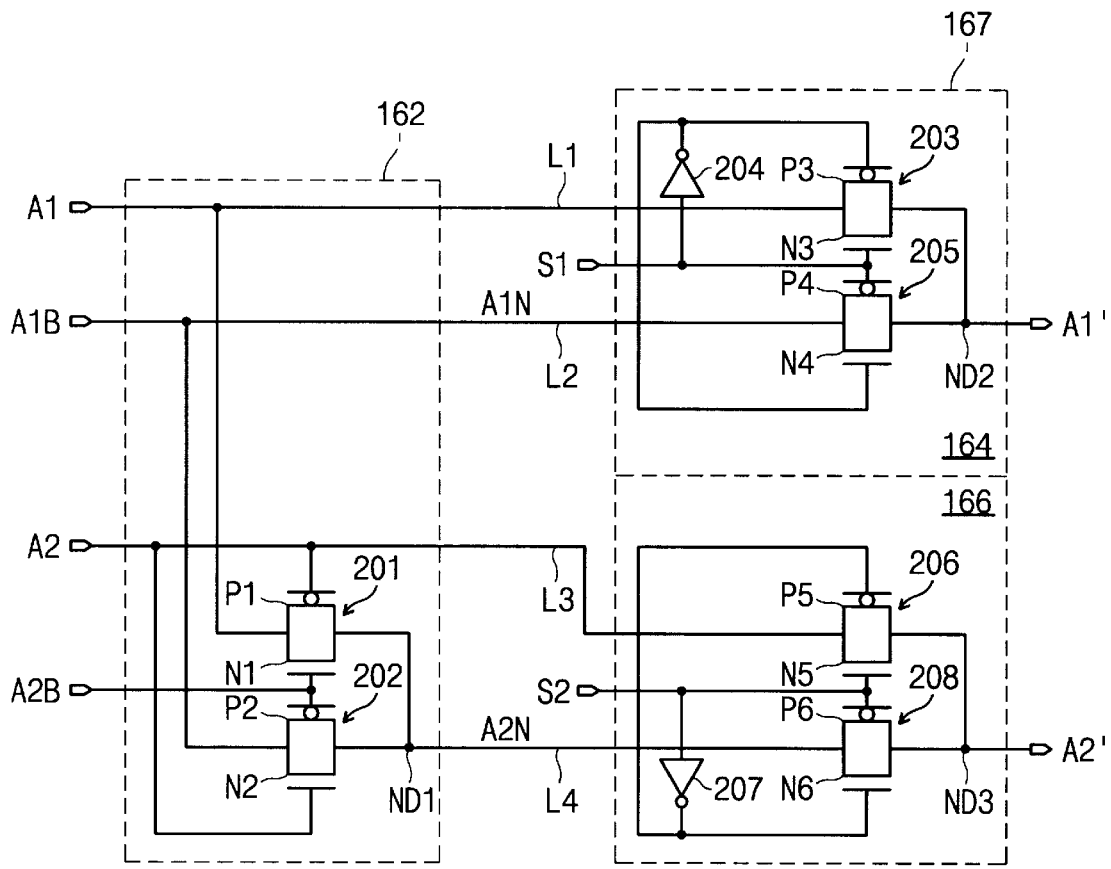
FIG. 5, is a detailed circuit diagram of the second address generator of FIG. 4.
Figure 5:
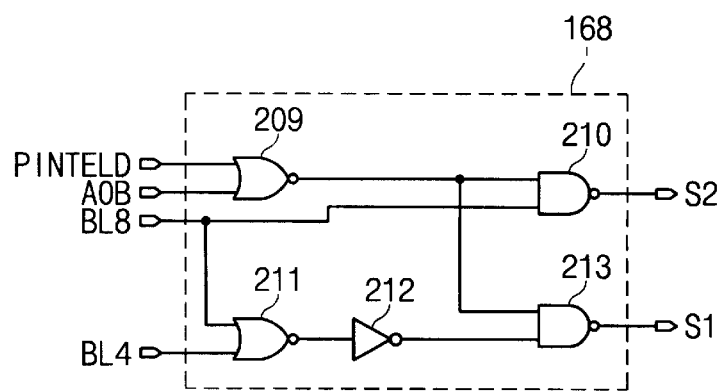

FIG. 4 shows a block diagram of the second address generator 160A, and FIG. 5 shows a detailed circuit diagram of it. Assuming that the burst-type random access memory device provides a burst length of 4 and a burst length of 8, the initial address from the exterior is 3-bit address.

Referring to FIG. 4, the second address generator 160A comprises an address incrementor 162, a selector 167 and a select signal generator 168. The address incrementor 162 receives as its input signals address bit signals A(1, 2) and complementary address bit signals A(1B, 2B) from the address buffer 100 or from the first address generator 120. Incrementor 162 then increments a value of the address bit signals A(1, 2) by one. For example, assume that the address bit signals A(0, 1, 2) from the address buffer 100 is '111'. Under this condition, the address bit signals A(1, 2) are '11' and the address bit signals A(1N, 2N) from the address incrementor 162 may be '00'.

As illustrated in FIG. 5, the address incrementor 162 is comprised of two transmission gates 201 and 202, each of which is composed of a PMOS and an NMOS transistor. When the address bit signals A(1, 2) are '11', the complementary address bit signals A(1B, 2B) are '00'. Then the PMOS and NMOS transistors P2 and N2 of the transmission gate 202 are turned on, and the PMOS and NMOS transistors P1 and N1 of the transmission gate 201 are turned off.

Therefore, the address incrementor 162 outputs the address bit signals A(1N, 2N) of '00' as its output signals.

Returning to FIG. 4, the selector 167 has two multiplexers 164 and 166. One of the multiplexers 164 and 166 receives two address bit signals A(1, 1N) to output one of the received signals A(1, 1N) as its output signal A1', in response to a select signal S1 from the select signal generator 168. The other of the multiplexers 164 and 166 receives two address bit signals A(2, 2N) to output one of the received signals A(2, 2N) as its output signal A2', in response to a select signal S2 from the select signal generator 168.

Referring to FIG. 5 again, the multiplexer 164 is comprised of one inverter 204, and two transmission gates 203 and 205, each of which has a PMOS and an NMOS transistor. Current paths of transistors P3 and N3 in the transmission gate 203 are formed between a signal line L1 and a node ND2. A gate electrode of the transistor P3 is coupled via the inverter 204 to the select signal S1, and a gate electrode of the transistor N3 is directly to the select signal S1. A PMOS transistor P4 of the transmission gate 205, whose gate electrode is coupled to the select signal S1, has its current path formed between a signal line L2 and the node ND2. A transistor N4 in the transmission gate 205 has its gate electrode coupled via the inverter 204 to the select signal S1, and its current path formed between the signal line L2 and the node ND2.

When the select signal S1 turns to a logic low level, the signal line L2 for transferring the address bit signal A1N is coupled via the transmission gate 205 to the node ND2 for outputting an output signal A1'. And, when the select signal S1 goes high, the signal line L1 for transferring the address bit signal A1 is coupled via the transmission gate 203 to the node ND2.

Similarly, the multiplexer 166 is comprised of one inverter 207, and two transmission gates 206 and 208, each of which has a PMOS and an NMOS transistor. Current paths of transistors P5 and N5 in the transmission gate 206 are formed between a signal line L3 and a node ND3. A gate electrode of the transistor P5 is coupled via the inverter 207 to the select signal S2, and a gate electrode of the transistor N5 is directly to the select signal S2. A PMOS transistor P6 of the transmission gate 208, whose gate electrode is coupled to the select signal S2, has its current path formed between a signal line L4 and the node ND3. A transistor N6 in the transmission gate 208 has its gate electrode coupled via the inverter 207 to the select signal S2, and its current path formed between the signal line L4 and the node ND3.

When the select signal S2 turns to a logic low level, the signal line L4 for transferring the address bit signal A2N is coupled via the transmission gate 208 to the node ND3 for outputting an output signal A2'. And, when the select signal S2 transitions from a logic low level to a logic high level, the signal line L3 for transferring the address bit signal A2 is coupled via the transmission gate 206 to the node ND3.

Referring again to FIG. 4, the select signal generator 168 receives burst information signals PINTELD (derived from a mode register set, not shown in the drawings), BLi (i=4, 8), and an address bit signal A0B, for generating the select signals S1 and S2. The signal PINTELD indicates whether a burst-type random access memory device operates at an interleaved mode or at a sequential mode. For example, when the burst-type random access memory device operates at an interleaved mode, the signal PINTELD turns to a logic high level. When burst-type random access memory device operates at the sequential mode, the signal PINTELD turns to a logic low level.

The signal BLi indicates whether a burst length is 4 or 8. For example, when the burst length is 4, the signals BL4 and BL8 turns to a logic high level and to a logic low level, respectively.

The signal A0B, that is, a signal complementary to an address bit signal A0, indicates whether the initial address and the sequence of addresses are an odd-numbered address or an even-numbered address. For example, when A0B=1, the initial address or the sequence of addresses from the first address generator 120 is an even-numbered address. When A0B=0, the initial address or the sequence of addresses from the first address generator 120 is an odd-numbered address.

The above requires that the select signals S1 and S2 assume a specific set of logic states. These logic states are shown in Table 1 of FIG. 6.

Referring back to FIGS. 4 and 5, the select signal generator 168 is chosen to generate these logic states. The select signal generator 168 is comprised of one inverter 212, two NOR gates 209 and 211 and two NAND gates 210 and 213. The NOR gate 209 has two input terminals for respectively receiving the signals PINTELD and A0B, and an output terminal of the NOR gate 209 is coupled to an input terminal of the NAND gate 210. The NAND gate 210 has the other input terminal for receiving the signal BL8 and an output terminal for outputting the select signal S2. The signals BL4 and BL8 are respectively provided to input terminals of the NOR gate 211, and the NAND gate 213 has two input terminals coupled to the output terminal of the NOR gate 209 and to the output terminal of the NOR gate 211 via the inverter 212, respectively. The select signal S1 is provided from the output terminal of the NAND gate 213.

Figures 6, 7:
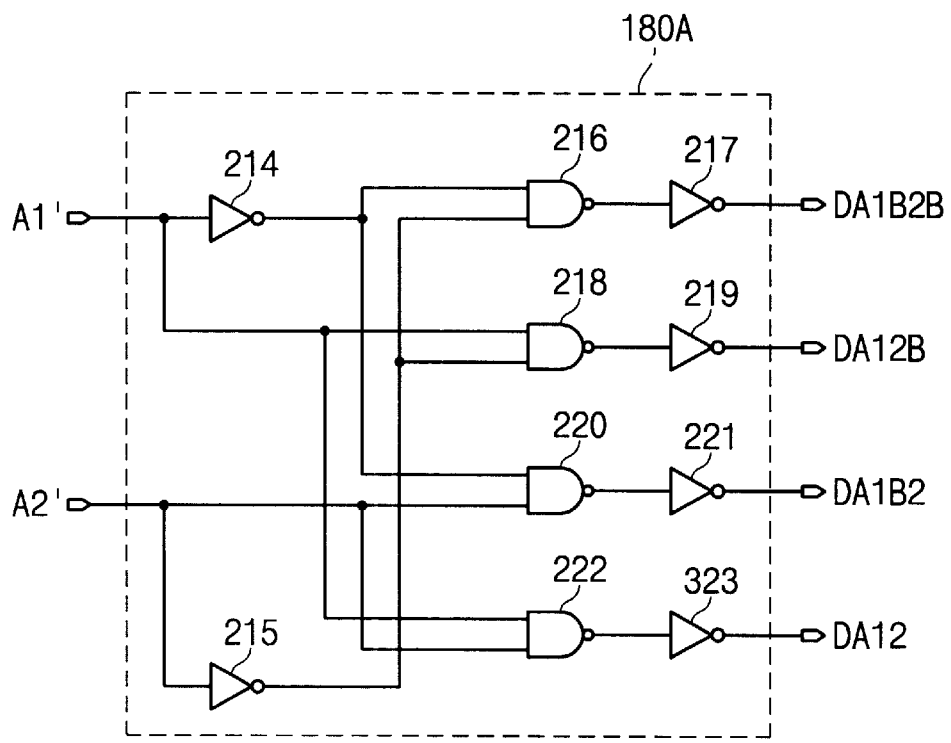
FIG. 6 is a table showing values of select signals output by circuit 168 of FIG. 5.
FIG. 7 is a detailed schematic of a preferred embodiment of the second decoder for use with the second address generator of FIG. 5.

FIG. 7 is a preferred embodiment of a second decoder 180A illustrated in FIG. 4. The second decoder 180A receives and decodes the outputs A1' and A2' from the second address generator 160A, so that one of its output signals DA12, DA1B2, DA12B and DA1B2B is activated. The decoder 180A is comprised of four NAND gates 216, 218, 220 and 222, and six inverters 214, 215, 217, 219, 221 and 323 connected as illustrated in FIG. 7.

An operation of the address generating and decoding circuit of the first embodiment of the present invention is now more fully described with reference to FIGS. 3 to 7.

Assume that the burst length of the burst-type random access memory device with the DDR scheme is 4, and that the burst-type random access memory device operates at the sequential mode.

First, when the initial address is inputted to the address buffer 100 from the exterior, it is transferred to the first decoder 140 so as to be decoded. At the same time, the initial address is supplied to the first and the second address generators 120 and 160, embodied as 160A. The first address generator 120 generates a sequence of addresses for the first half period of each clock cycle, in response to the initial address from the address buffer 100. Similarly, the second address generator 160A generates a sequence of addresses for the second half period of each clock cycle, in response to the initial address and the sequence of addresses.

As a first example, assume that the initial address A(0, 1, 2) for the first half period is '111'. Then the select signal S1 of a logic low level and the select signal S2 of a logic high level are generated from the select signal generator 168 of FIG. 5, as illustrated in table 1 of FIG. 6.

The address incrementor 162 of the second address generator 160A receives address bit signals A(1, 2) of '11' and complementary address bit signals A(1B, 2B) of '00', and increments a value of the address bit signals A(1, 2) by one, to output address bit signals A(1N, 2N) as its output signals. In particular, since the signals A2 and A2B are high and low, respectively, the address bit signal A1B is transferred onto the signal line L4 as one output signal A2N of the address incrementor 162. And, the address bit signal A1B is also transferred onto the signal line L2 as the other output signal A1N of the address incrementor 162. As a result, the signals A(1N, 2N) from the address incrementor 162 become '00'.

Then, as seen in FIG. 5, the multiplexer 164 of the selector 167 selects the signal A1N on the signal line L2 as its output signal A1', in response to the select signal S1 of a logic low level. At the same time, the multiplexer 166 of the selector 167 selects the signal A2 on the signal line L3 as its output signal A2', in response to the select signal S2 of a logic high level. Therefore, the second address generator 160A generates the address bit signals A(1', 2') of '01', which correspond to the second half period of the clock cycle. The address bit signals A(1', 2') of '01' are decoded by means of the second decoder 180A. Herein, since the address bit signal A0B (that is, A0) is used by generating the select signals S1 and S2, it is not inputted to the second decoder 180A.

As another example, assume that the burst length of the burst-type random access memory device with the DDR scheme is 8, and that the burst-type random access memory device operates at the sequential mode. Operations of the address buffer 100, the first address generator 120 and the first decoder 140 are identical to those above described in the one example (BL4), and description thereof is thus omitted. On the other hand, the select signal S1 of a logic low level and the select signal S2 of a logic low level are generated from the select signal generator 168 of FIG. 5 in accordance with the above described condition.

First, the address incrementor 162 receives address bit signals A(1, 2) of '11' and complementary address bit signals A(1B, 2B) of '00', and increases a value of the address bit signals A(1, 2) by one to output address bit signals A(1N, 2N) as its output signals. In particular, since the signals A2 and A2B are high and low, respectively, the address bit signal A1B is transferred onto the signal line L4 as one output signal A2N of the address incrementor 162. And, the address bit signal A1B is also outputted onto the signal line L2 as the other output signal A1N of the address incrementor 162. As a result, the signals A(1N, 2N) from the address incrementor 162 become '00'.

Then, the multiplexer 164 of the selector 167 selects the signal A1N on the signal line L2 as its output signal A1' in response to the select signal S1 of a logic low level. At the same time, the multiplexer 166 of the selector 167 selects the signal A2N on the signal line L4 as its output signal A2' in response to the select signal S2 of a logic low level. Therefore, the second address generator 160A generates the address bit signals A(1', 2') of '00', which correspond to the second half period of the clock cycle. The address bit signals A(1', 2') of '00' are decoded by means of the second decoder 180A.

From the above described examples, it can be seen that the address bit signals A(1', 2') are '01' in the former case (BL=4), while the address bit signals A(1', 2') are '00'. The reason is as follows. In the case where the random access memory device is set with a burst length of 4 (BL4), an address bit signal A2 of the initial address A(0, 1, 2) from the exterior must be maintained without a level change during the burst mode of operation. But, in the case where the random access memory device is set with a burst length of 8 (BL8), an address bit signal A2 of the initial address A(0, 1, 2) from the exterior must be changed during the burst mode of operation. Therefore, when the initial address A(0, 1, 2) is '111', an address A(1', 2') for the second half period becomes '01' in the former case (BL=4) and '00' in the latter case (BL=8), respectively.

In the first embodiment, the operation of the second address generator 160A is the same as the above described examples, when the burst-type random access memory device with the DDR scheme operates at the interleaved mode.

The second preferred embodiment of the invention is now described with reference to FIGS. 8–11.

Figure 8:
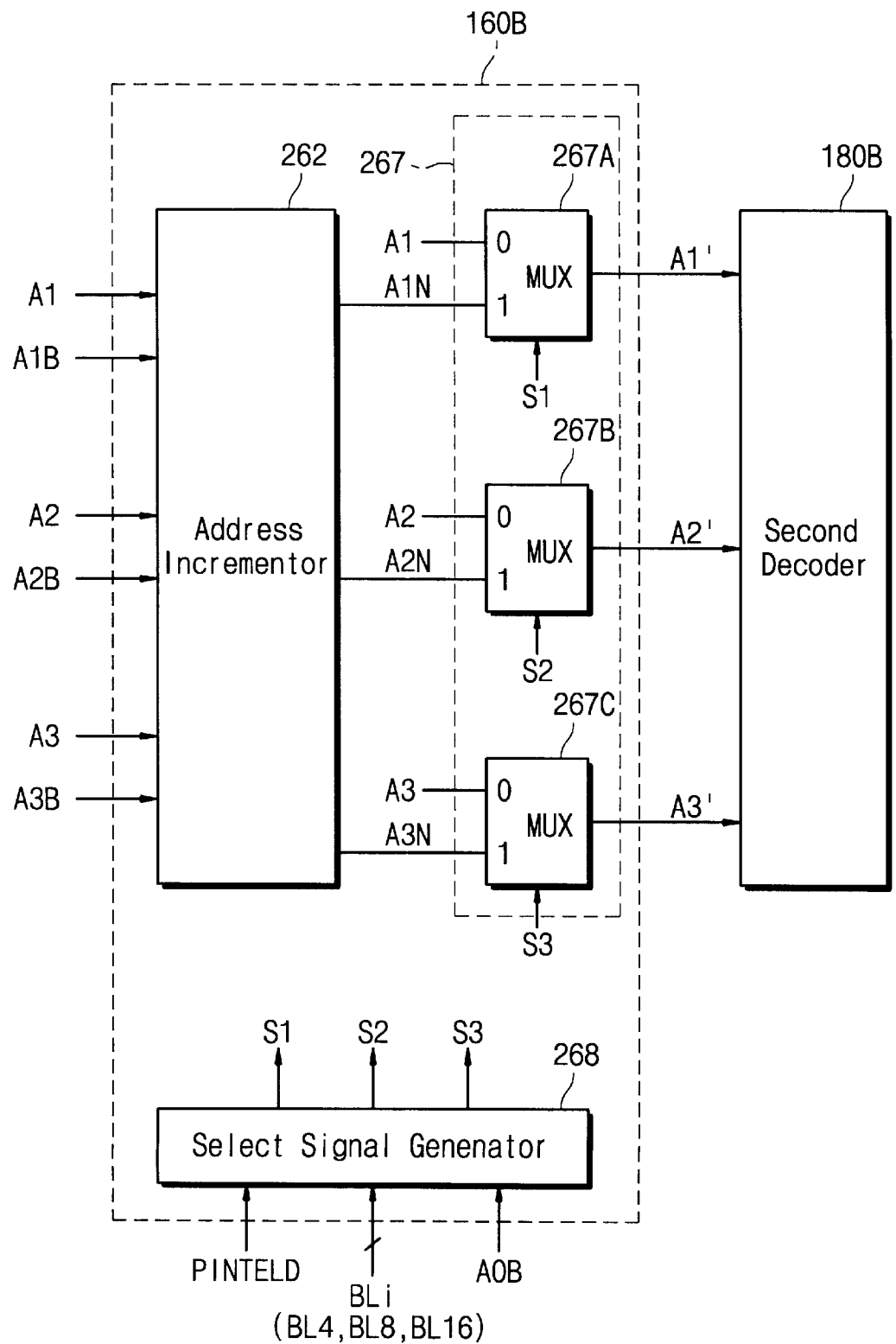
FIG. 8 shows a block diagram of the second address generator of FIG. 3 according to a second preferred embodiment of the present invention.
Figure 9:
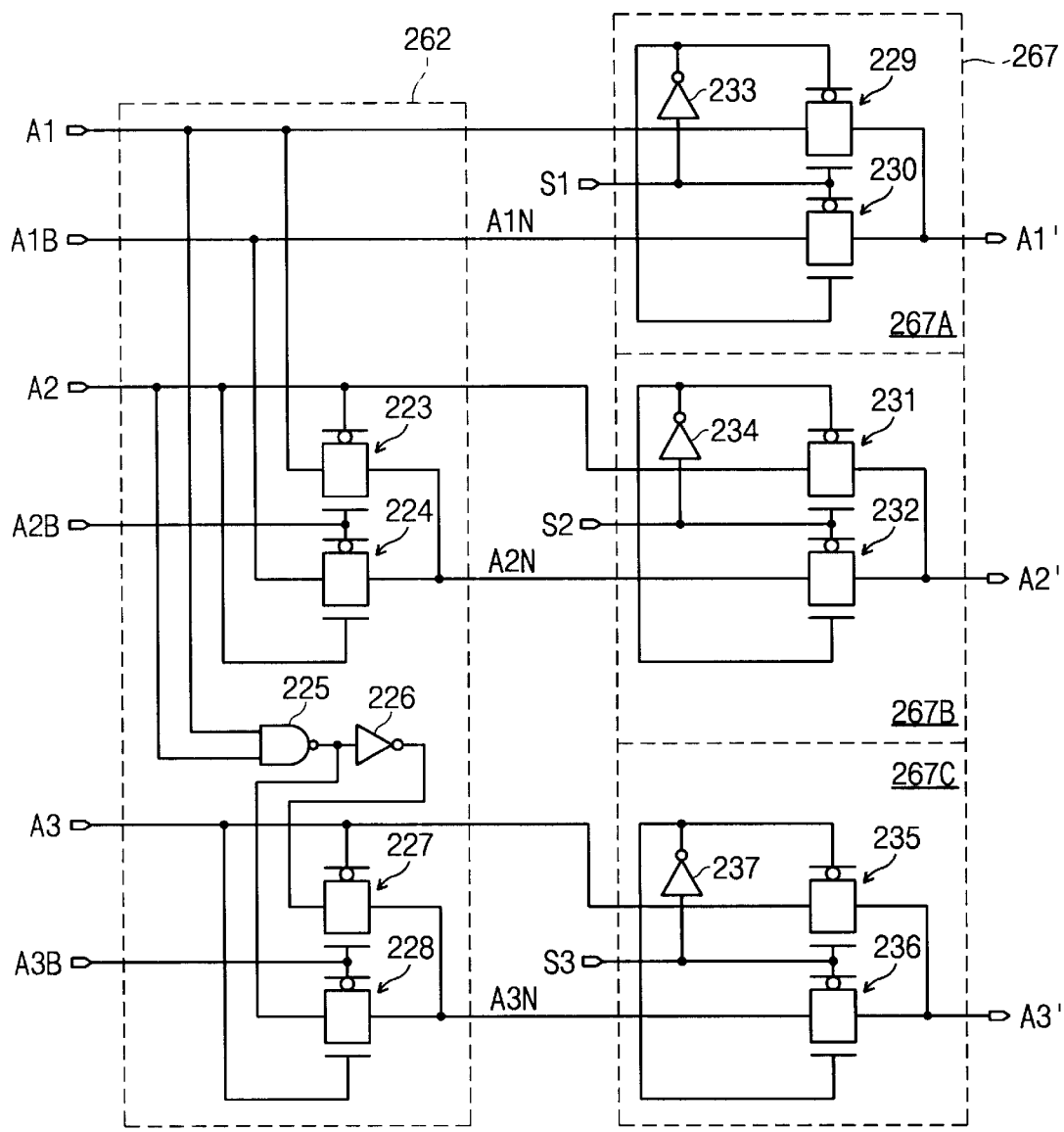
FIG. 9 is a detailed circuit diagram of the second address generator of FIG. 8.
Figure 9:
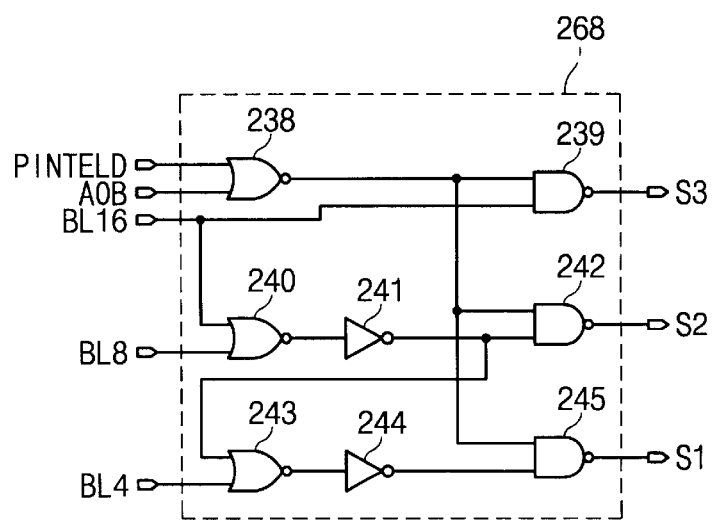

FIG. 8 shows a block diagram of the second address generator 160B, and FIG. 9 shows a detailed circuit diagram of it. In FIGS. 8 and 9, the constituent elements that are identical to those of FIGS. 4 and 5 are labeled by the same reference numerals. The second address generator 160B of FIG. 8 is implemented so as to support the burst lengths of 4, 8, and 16, and thus the initial address from the exterior is 4-bit address.

Referring to FIG. 8, the second address generator 160B comprises an address incrementor 262, a selector 267 and a select signal generator 268. The address incrementor 262 receives as its input signals address bit signals A(1, 2, 3), and complementary address bit signals A(1B, 2B, 3B) from the address buffer 100 or from the first address generator 120. Incrementor 262 then increments a value of the address bit signals A(1, 2, 3) by one. For example, assume that the address bit signals A(0, 1, 2, 3) from the address buffer 100 is '1111'. Under this condition, the address bit signals A(1, 2, 3) is '111' and the address bit signals A(1N, 2N, 3N) from the address incrementor 262 may be '000'.

As illustrated in FIG. 9, the address incrementor 262 is comprised of a two-input NAND gate 225, an inverter 226, and four transmission gates 223, 224, 227 and 228, each of which is composed of a PMOS and an NMOS transistor. When the address bit signals A(1, 2, 3) are '000', the complementary address bit signals A(1B, 2B, 3B) are '000'. Then the transmission gates 224 and 228 are activated, and the transmission gates 223 and 227 are inactivated. Output signal from the NAND gate 225 has a logic low level. Therefore, the address bit signals A(1N, 2N, 3N) from the address incrementor 262 become '000'.

Returning to FIG. 8, the selector 267 has three multiplexers 267A, 267B and 267C. The first multiplexer 267A receives two address bit signals A(1, 1N) to output one of the received signals A(1, 1N) as its output signal A1', in response to a select signal S1 from the select signal generator 268. A second multiplexer 267B receives two address bit signals A(2, 2N) to output one of the received signals A(2, 2N) as its output signal A2', in response to a select signal S2 from the select signal generator 268. And, a third multiplexer 267C receives two address bit signals A(3, 3N) to output one of the received signals A(3, 3N) as its output signal A3', in response to a select signal S3 from the select signal generator 268.

Referring to FIG. 9 again, the first, the second and the third multiplexer 267A, 267B and 267C are each comprised of one inverter and two transmission gates connected as illustrated in FIG. 9. Inverters 233, 234, 237 receive the selection signals S1, S2, S3 respectively for controlling transmission gates 229–232, 235, 236.

Referring again to FIG. 8, the select signal generator 268 receives signals PINTELD, BLi (i=4, 8, 16), and A0B to generate the select signals S1, S2 and S3. As illustrated in FIG. 9, the select signal generator 268 is comprised of three NOR gates 238, 240 and 243, two inverters 241 and 244, and three AND gates 239, 242 and 245.

The signal PINTELD indicates whether a burst-type random access memory device operates at an interleaved mode or at a sequential mode. For example, when the burst-type random access memory device operates at an interleaved mode, the signal PINTELD turns to a logic high level. When burst-type random access memory device operates at the sequential mode, the signal PINTELD turns to a logic low level.

The signal BLi indicates whether a burst length is 4, 8, or 16. For example, when the burst length is 4, the signals BL4, BL8 and BL16 turns to a logic high level, to a logic low level, and to a logic low level, respectively.

The signal A0B, that is, a signal complementary to an address bit signal A0, indicates whether the initial address and the sequence of addresses are an odd-numbered address or an even-numbered address. For example, when A0B=1, the initial address or the sequence of addresses from the first address generator 120 is an even-numbered address. When A0B=0, the initial address or the sequence of addresses from the first address generator 120 is an odd-numbered address.

The above requires that the select signals S1, S2 and S3 assume a specific set of logic states. These logic states are shown in Table 2 of FIG. 10.

Referring back to FIGS. 8 and 9, the select signal generator 268 is chosen to generate these logic states. It is made of three NOR gates 238, 240, 243, two inverters 241, 244 and 3 AND gates 239, 242, 245.

Figure 11:
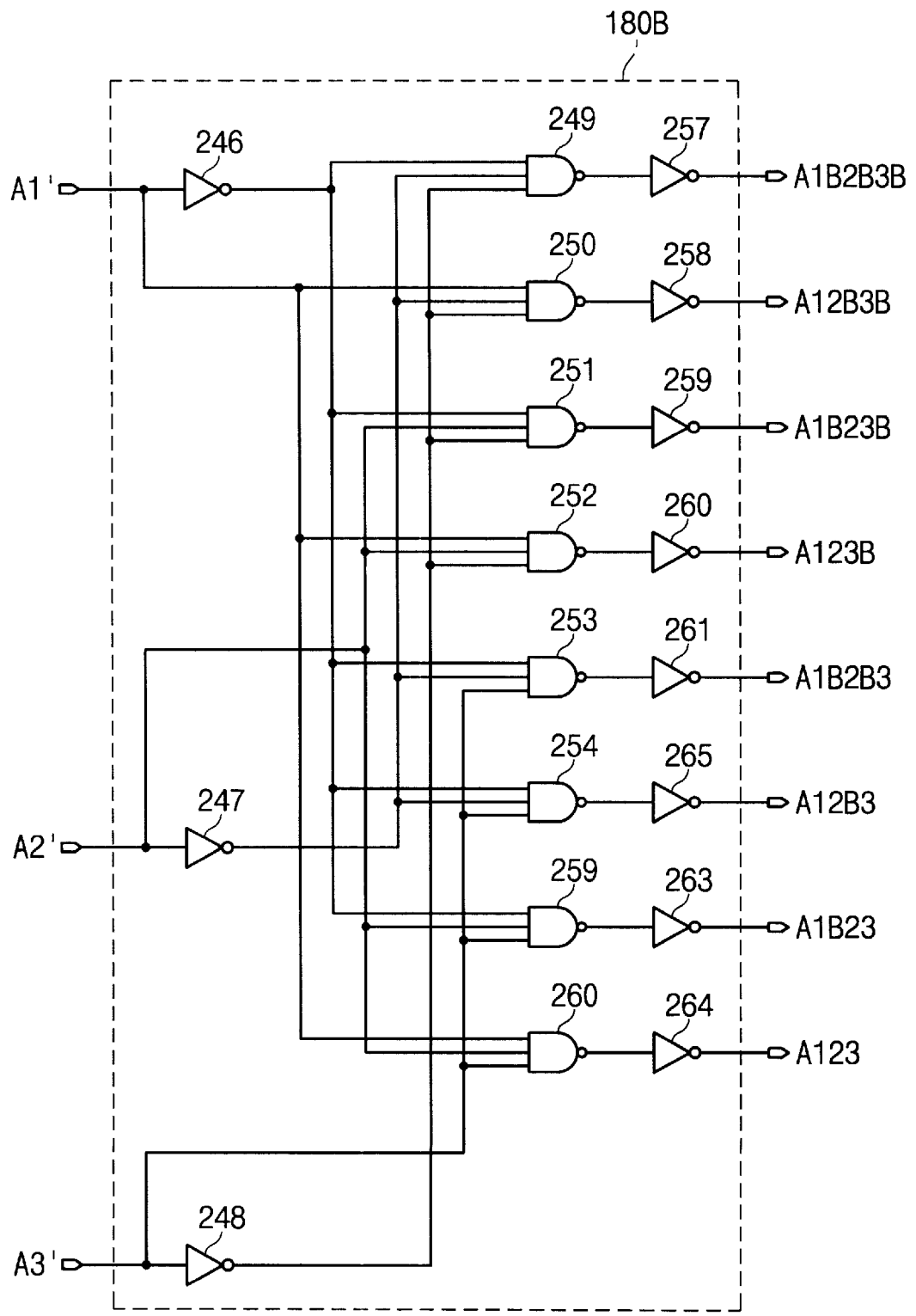
FIG. 11 is a detailed schematic of a preferred embodiment of the second decoder for use with the second address generator of FIG. 9.

FIG. 11 is a preferred embodiment of a second decoder 180B illustrated in FIG. 8. The second decoder 180B receives and decodes the outputs A1', A2' and A3' from the second address generator 160B, so that one of its output signals A123, A1B23, A12B3, A1B2B3, A123B, A1B23B, A12B3B, A1B2B3B is activated. The decoder 180B is comprised of eight NAND gates 249–254, 259, 260, and eleven inverters 246–248, 257–261, 263–265 connected as illustrated in FIG. 11.

An operation of the address generating and decoding circuit of the second embodiment of the present invention is now more fully described with reference to FIGS. 8 to 11.

Assume that the burst length of the burst-type random access memory device with the DDR scheme is 4, and that the burst-type random access memory device operates at the sequential mode.

When the initial address is inputted to the address buffer 100 from the exterior, it is transferred to the first decoder 140 so as to be decoded. At the same time, the initial address is supplied to the first and the second address generator 120 and 160, embodied as 160B. The first address generator 120 generates a sequence of addresses for the first half period of each clock cycle, in response to the initial address from the address buffer 100. Similarly, the second address generator 160B generates a sequence of addresses for the second half period of each clock cycle in response to the initial address and the sequence of addresses.

As a first example, the initial address A(0, 1, 2, 3) for the first half period is '1111'. Then, the select signal S1 of a logic low level, the select signal S2 of a logic high level and the select signal S3 of a logic high level are generated from the select signal generator 268 of FIG. 9, as shown in the table 2.

The address incrementor 262 of the second address generator 160B receives address bit signals A(1, 2, 3) of '111' and complementary address bit signals A(1B, 2B, 3B) of '000', and increases a value of the address bit signals A(1, 2, 3) by one, to output address bit signals A(1N, 2N, 3N) as its output signals. In particular, the signal A1B is used as a first output signal A1N of the address incrementor 262. Since the signals A2 and A3 turn to a logic high level and the signals A2B and A3B turn to a logic low level, the address bit signal A1B is outputted as a second output signal A2N of the address incrementor 262. And, the output of a logic low level from the NAND gate 225 is transferred via the transmission gate 228 as a third output signal A3N of the address incrementor 262. As a result, the signals A(1N, 2N, 3N) from the address incrementor 262 become '000'.

Then, the multiplexer 267A selects the signal A1N as a first output signal A1' thereof in response to the select signal S1 of a logic low level, the multiplexer 267B selects the signal A2 as a second output signal A2' thereof in response to the select signal S2 of a logic high level, and the multiplexer 267C selects the signal A3 as a third output signal A3' thereof in response to the select signal S3 of a logic high level. Therefore, the second address generator 160B generates the address bit signals A(1', 2', 3') of '011', which correspond to the second half period of the clock cycle. The address bit signals A(1', 2', 3') are decoded by means of the second decoder 180B.

When the burst-type random access memory device performs a 4-burst operation, address bit signals A(2, 3) of the initial address A(0, 1, 2, 3) needn't be changed. Therefore, it can be seen from the above description that the address bit signals A(1', 2', 3') of '011' corresponding to the second half period of the clock cycle are generated from the second address generator 160B.

As another example, assume that the burst length of the burst-type random access memory device with the DDR scheme is 8, and that the burst-type random access memory device operates at the sequential mode. Operations of the address buffer 100, the second address generator 120 and the first decoder 140 are identical to those above described in the one example (BL4), and description thereof is thus omitted. When the initial address A(0, 1, 2, 3) for the first half period is '1111', the select signals S1, S2 and S3 go low, low and high, respectively, as shown in the table 2. The operation of the second address generator will be described below.

The address incrementor 262 of the second address generator 160B receives address bit signals A(1, 2, 3) of '111' and complementary address bit signals A(1B, 2B, 2B) of '000', and increases a value of the address bit signals A(1, 2, 3) by one to output address bit signals A(1N, 2N, 3N) as its output signals. In particular, the signal A1B is used as a first output signal A1N of the address incrementor 262. Since the signals A2 and A3 turn to a logic high level and the signals A2B and A3B turn to a logic low level, the address bit signal A1B is outputted as a second output signal A2N of the address incrementor 262. And, the output of a logic low level from the NAND gate 225 is transferred via the transmission gate 228 as a third output signal A3N of the address incrementor 262. As a result, the signals A(1N, 2N, 3N) from the address incrementor 262 become '000'.

Then, the multiplexer 267A selects the signal A1N as a first output signal A1' thereof in response to the select signal S1 of a logic low level, the multiplexer 267B selects the signal A2B as a second output signal A2' thereof in response to the select signal S2 of a logic low level, and the multiplexer 267C selects the signal A3 as a third output signal A3' thereof in response to the select signal S3 of a logic high level. Therefore, the second address generator 160B generates the address bit signals A(1', 2', 3') of '001', which correspond to the second half period of the clock cycle. The address bit signals A(1', 2', 3') are decoded by means of the second decoder 180B.

When the burst-type random access memory device performs an 8-burst operation, an address bit signal A3 of the initial address A(0, 1, 2, 3) needn't be changed. Therefore, it can be seen from the above description that the address bit signals A(1', 2', 3') of '001' corresponding to the second half period of the clock cycle are generated from the second address generator 160B.

In the case where the burst length BL of the burst-type random access memory device with the DDR scheme is 16, and that the burst-type random access memory device operates at the sequential mode, operations of the address buffer 100, the second address generator 120 and the first decoder 140 are identical to those above described in the one example (BL4), and description thereof is thus omitted. When the initial address A(0, 1, 2, 3) for the first half period is '1111', all of the select signals S1, S2 and S3 go low, as shown in the table 2. The operation of the second address generator will be described below.

The address incrementor 262 of the second address generator 160B receives address bit signals A(1, 2, 3) of '111' and complementary address bit signals A(1B, 2B, 2B) of '000', and increases a value of the address bit signals A(1, 2, 3) by one to output address bit signals A(1N, 2N, 3N) as its output signals. In particular, the signal A1B is used as a first output signal A1N of the address incrementor 262. Since the signals A2 and A3 turn to a logic high level and the signals A2B and A3B turn to a logic low level, the address bit signal A1B is outputted as a second output signal A2N of the address incrementor 262. And, the output of a logic low level from the NAND gate 225 is transferred via the transmission gate 228 as a third output signal A3N of the address incrementor 262. As a result, the signals A(1N, 2N, 3N) from the address incrementor 262 become '000'.

Then, the multiplexer 267A selects the signal A1N as a first output signal A1' thereof, in response to the select signal S1 of a logic low level, the multiplexer 267B selects the signal A2B as a second output signal A2' thereof, in response to the select signal S2 of a logic low level, and the multiplexer 267C selects the signal A3B as a third output signal A3' thereof, in response to the select signal S3 of a logic low level. Therefore, the second address generator 160B generates the address bit signals A(1', 2', 3') of '000', which correspond to the second half period of the clock cycle. The address bit signals A(1', 2', 3') are decoded by means of the second decoder 180B.

According to the first and second embodiments of the present invention, the second address generator 160 is implemented such that the address for the second half period of a clock cycle is automatically generated depending on the burst length and mode, instead of combining logic gate circuits for all practicable combinations associated with the burst length. Therefore, it is possible to speed up the access of the burst-type random access memory device with the DDR scheme. Furthermore, as seen in FIGS. 5 and 9, although the number of the burst lengths increases, the second address generator 160B can be implemented easily by adding only a few elements, for example, transmission gates and logic gates (inverter and NAND gate). This means that the expansion of the second address generator, that is, the address generating and decoding circuit, is good when the number of the burst lengths increases.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A burst-type random access memory device having a memory cell array for storing data and having a double data rate scheme in which at least two data is inputted/outputted to/from the memory device during a clock cycle, the memory device comprising:

an address buffer for receiving an externally applied initial address;

a first address generator for sequentially generating first addresses in response to the initial address from the address buffer, wherein the first addresses correspond to a first half period of the clock cycle during a burst mode of operation, respectively; and a second address generator for receiving the first addresses and generating second addresses in accordance with burst information signals indicative of a burst length and a type of the burst mode of operation, wherein the second addresses correspond to a second half period of the clock cycle during the burst mode of operation, respectively.

2. The memory device according to claim 1, further comprising:

a first decoder for decoding the first addresses from the first address generator in sequence; and a second decoder for decoding the second addresses from the second address generator in sequence.

3. The memory device according to claim 2, wherein the first address generator is comprised of a counter.

4. The memory device according to claim 3, wherein the second address generator comprises:

an address incrementor for receiving remaining address bits of a first address except a least significant bit and for incrementing a value of the remaining address bits by one to output the incremented address bits as a third address, wherein the remaining address bits correspond to the incremented address bits, respectively;

a select signal generator for generating select signals in response to the burst information signals and the least significant bit of the first address, wherein the select signals correspond to the incremented address bits, respectively; and a selector for receiving the remaining address bits and the incremented address bits, wherein the selector chooses one of corresponding address bits of the first and the third address in response to the select signals and outputs the chosen address bits as a second address.

5. The memory device according to claim 4, wherein the burst information signals are derived from a mode register set installed in the memory device.

6. A burst-type random access memory device having a memory cell array for storing data and having a double data rate scheme in which at least two data is inputted/outputted to/from the memory device during a clock cycle, the memory device comprising:

an address buffer for receiving an externally applied initial address;

an address generator for generating first addresses in response to the initial address from the address buffer, wherein the first addresses corresponds to a first half period of the clock cycle during a burst mode of operation, respectively; and a second address generator for generating second addresses in response to the first addresses, wherein the second address generator comprises:

an address incrementor for receiving remaining address bits of a first address except a least significant bit and incrementing a value of the remaining address bits by one to output the incremented address bits as a third address, wherein the remaining address bits correspond to the incremented address bits, respectively;

a select signal generator for generating select signals in response to burst information signals and the least significant bit of the first address, wherein the select signals correspond to the incremented address bits, respectively; and a selector for receiving the remaining address bits and the incremented address bits, wherein the selector chooses one of corresponding address bits of the first and the third address in response to the select signals and outputs the chosen address bits as a second address.

7. The memory device according to claim 6, wherein the first address generator is comprised of a counter.

8. The memory device according to claim 6, further comprising:

a first decoder for decoding the first addresses from the first address generator in sequence; and a second decoder for decoding the second addresses from the second address generator in sequence.

9. The memory device according to claim 6, wherein the burst information signals indicate a burst type and a burst length, respectively, and are derived from a mode register set installed in the memory device.

10. A method of generating an address for a burst mode of operation in a burst-type random access memory device having a double data rate scheme in which at least two data is inputted/outputted to/from the random access memory device during a clock cycle, the method comprising the steps of:

receiving a first address as an initial address from the exterior;

generating select signals in response to burst information signals and a least significant bit of the first address;

receiving remaining address bits of the initial address except the least significant bit and incrementing a value of the remaining address bits by one to output the incremented address bits as a second address; and receiving the remaining address bits the incremented address bits and choosing one of corresponding address bits of the first and the second address in response to the select signals to output the chosen address bits as a next address of the initial address.

11. The method according to claim 10, wherein the burst information signals indicate a burst length and a type of the burst mode of operation, and are derived from a mode register set installed in the memory device.

12. The method according to claim 11, further comprising the step of receiving the next address to decode the received next address.

13. The method according to claim 11, further comprising the steps of generating a third address in response to the initial address; and receiving the third address to decode the received third address, wherein the first and the third address is used during a first half period of the clock cycle and the next address is used during a second half period of the clock cycle.

* * * * *

UNITED STATES PATENT AND TRADEMARK OFFICE
CERTIFICATE OF CORRECTION

PATENT NO. : 6,272,065 B1
DATED : August 7, 2001
INVENTOR(S) : Kim

It is certified that error appears in the above-identified patent and that said Letters Patent is hereby corrected as shown below:

Column 8,
Line 37, "A(1, 2, 3) are '000'" should read -- A(1, 2, 3) are '111' --.

Signed and Sealed this

Fifteenth Day of October, 2002

*Attest:*

*Attesting Officer*

JAMES E. ROGAN
*Director of the United States Patent and Trademark Office*